(12) United States Patent
Sato

(10) Patent No.: US 11,451,238 B2
(45) Date of Patent: Sep. 20, 2022

(54) RECORDING DEVICE AND RECORDING METHOD

(71) Applicant: OMRON Corporation, Kyoto (JP)

(72) Inventor: Kenji Sato, Kusatsu (JP)

(73) Assignee: OMRON CORPORATION, Kyoto (JP)

( * ) Notice: Subject to any disclaimer, the term of this patent is extended or adjusted under 35 U.S.C. 154(b) by 289 days.

(21) Appl. No.: 16/644,001

(22) PCT Filed: Jan. 31, 2019

(86) PCT No.: PCT/JP2019/003512
§ 371 (c)(1),
(2) Date: Mar. 3, 2020

(87) PCT Pub. No.: WO2019/155985
PCT Pub. Date: Aug. 15, 2019

(65) Prior Publication Data
US 2021/0067167 A1 Mar. 4, 2021

(30) Foreign Application Priority Data
Feb. 9, 2018 (JP) .............................. JP2018-022530

(51) Int. Cl.
*H03M 1/34* (2006.01)
*G01D 3/10* (2006.01)
*G01D 9/00* (2006.01)

(52) U.S. Cl.
CPC .............. *H03M 1/34* (2013.01); *G01D 3/10* (2013.01); *G01D 9/005* (2013.01)

(58) Field of Classification Search
CPC ............ G01D 9/005; G01D 3/10; H03M 1/34
See application file for complete search history.

(56) References Cited

U.S. PATENT DOCUMENTS

2007/0260937 A1   11/2007  Connally et al.
2008/0024286 A1   1/2008   Perras
(Continued)

FOREIGN PATENT DOCUMENTS

CN    101067561 A   11/2007
CN    106767969 A    5/2017
(Continued)

OTHER PUBLICATIONS

English translation of the International Search Report("ISR") of PCT/JP2019/003512 dated May 7, 2019.
(Continued)

*Primary Examiner* — Patrick C Chen
(74) *Attorney, Agent, or Firm* — Metrolex IP Law Group, PLLC

(57) ABSTRACT

To allow a time-series change among signal values to be recorded easily for a process of recording the respective time-series values of input signals, a recording device includes: a determination reference value obtaining section configured to obtain a determination reference value on a basis of signal values during a reference time period, the reference time period being a predetermined time period after a start of input of time-series signal values, the determination reference value indicating a feature of the signal values during the reference time period, and a recording control section configured to (i) obtain information on a recording start condition on a basis of the determination reference value, the recording start condition indicating whether, as compared to the signal values during the reference time period, there has been a large change among signal values after the reference time period has elapsed, and (ii) start recording signal values in response to the recording start condition becoming satisfied.

2 Claims, 15 Drawing Sheets

(56) References Cited

U.S. PATENT DOCUMENTS

| | | | |
|---|---|---|---|
| 2011/0055502 A1* | 3/2011 | Yamasaki | G01D 9/005 |
| | | | 711/E12.001 |
| 2013/0304419 A1 | 11/2013 | Nakamura et al. | |

FOREIGN PATENT DOCUMENTS

| | | |
|---|---|---|
| JP | H11-95833 A | 4/1999 |
| JP | 2009-287943 A | 12/2009 |
| JP | 2012-151216 A | 8/2012 |
| JP | 5223866 B2 | 6/2013 |

OTHER PUBLICATIONS

Written Opinion ("WO") of PCT/JP2019/003512 dated May 7, 2019.

Office Action (CNOA) dated May 17, 2021 in a counterpart Chinese patent application.

\* cited by examiner

| DETERMINATION MODE | MAGNIFICATION | SET MODE |
|---|---|---|
| INSENSITIVE MODE | 700% | OFF |
| NORMAL MODE | 500% | OFF |
| SENSITIVE MODE | 300% | ON |

FIG. 10

| DETERMINATION MODE | REFERENCE RANGE | SET MODE |
|---|---|---|
| INSENSITIVE MODE | $w_3$ | OFF |
| NORMAL MODE | $w_2$ | OFF |
| SENSITIVE MODE | $w_1$ | ON |

RECORDING DEVICE AND RECORDING METHOD

TECHNICAL FIELD

The present invention relates to a technique for recording an input signal.

BACKGROUND ART

A recording device for recording the respective values of input signals on a time-series basis typically temporarily accumulates signal values read in a buffer memory into a memory such as a random access memory (RAM) and outputs the signal values to a low-speed storage device such as a hard disc drive (HDD) at a predetermined time point.

CITATION LIST

Patent Literature

[Patent Literature 1]
Japanese Patent Application Publication, Tokukai, No. 2009-287943

SUMMARY OF INVENTION

Technical Problem

In a case where such a recording device is used to record a change among signal values over an extremely short time period, the recording device will need to record signal values over an extremely short sampling period (for example, a time period of approximately several microseconds). In such a case, however, the recording device will end up recording an enormous amount of signal values per unit time. This poses the risk of the RAM becoming out of free space in a short time period. Conventional art has required trial and error in carefully selecting when to recording signals in such a manner as to solve the above issue and reliably record signal values as a recording target. This has often resulted in a lot of effort being required to record signal values over a short sampling period.

In view of the above circumstances, the present invention has an object to provide a technique that allows a time-series change among signal values to be recorded more easily for a process of recording the respective time-series values of input signals.

Solution to Problem

An aspect of the present invention is a recording device including: a determination reference value obtaining section configured to obtain a determination reference value on a basis of signal values during a reference time period, the reference time period being a predetermined time period after a start of input of time-series signal values, the determination reference value indicating a feature of the signal values during the reference time period, and a recording control section configured to (i) obtain information on a recording start condition on a basis of the determination reference value, the recording start condition indicating whether, as compared to the signal values during the reference time period, there has been a large change among signal values after the reference time period has elapsed, and (ii) start recording signal values in response to the recording start condition becoming satisfied.

An aspect of the present invention is a recording method including: a determination reference value obtaining section step of obtaining a determination reference value on a basis of signal values during a reference time period, the reference time period being a predetermined time period after a start of input of time-series signal values, the determination reference value indicating a feature of the signal values during the reference time period, and a recording control step of (i) obtaining information on a recording start condition on a basis of the determination reference value, the recording start condition indicating whether, as compared to the signal values during the reference time period, there has been a large change among signal values after the reference time period has elapsed, and (ii) starting recording signal values in response to the recording start condition becoming satisfied.

Advantageous Effects of Invention

The present invention allows a time-series change among signal values to be recorded easily for a process of recording respective time-series values of input signals.

BRIEF DESCRIPTION OF DRAWINGS

FIG. 10 is a diagram illustrating a specific example of settings information of Embodiment 2.

DESCRIPTION OF EMBODIMENTS

Embodiment 1

Figure 1:
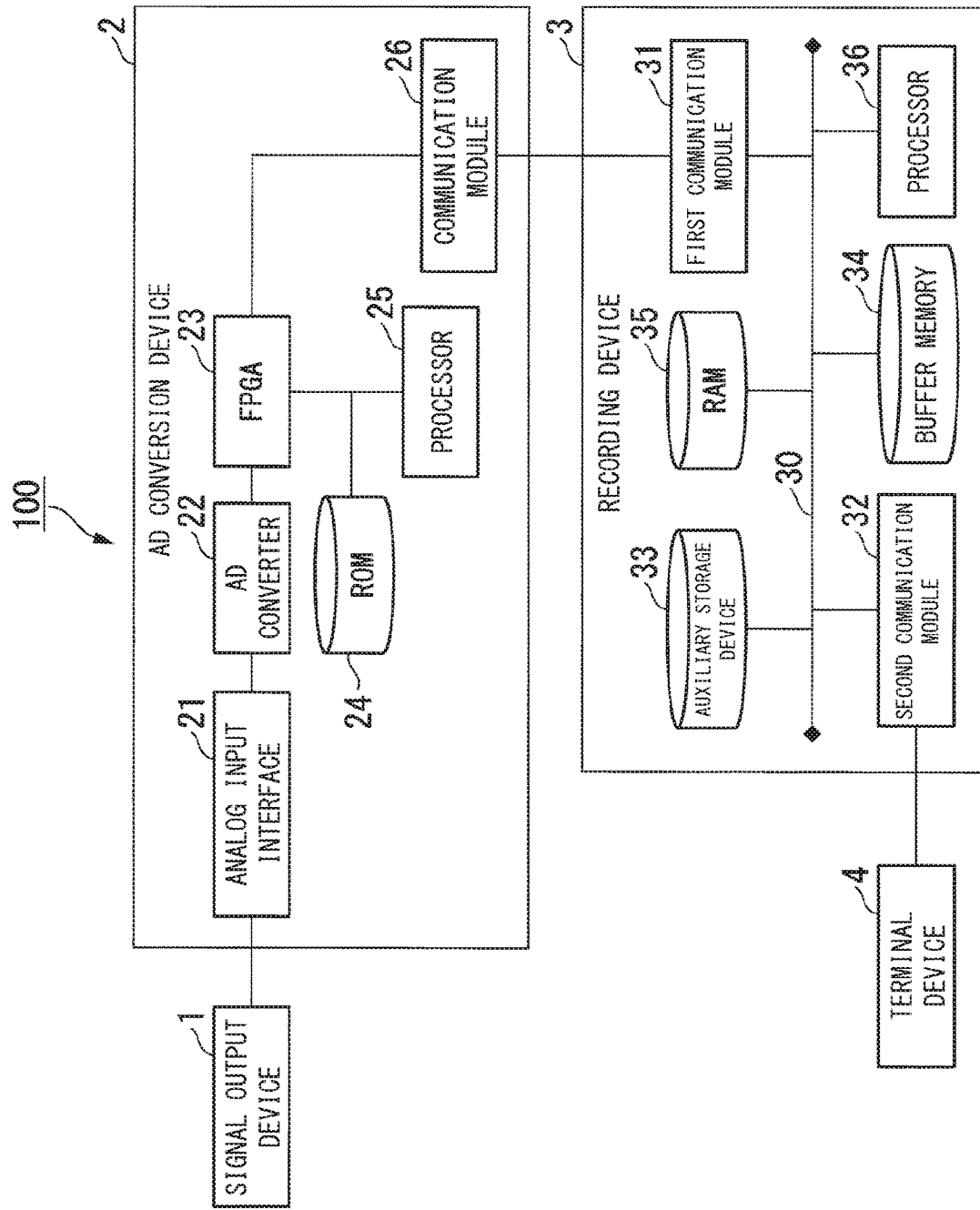
FIG. 1 is a diagram illustrating a specific example of how a measurement system as Embodiment 1 is configured.

FIG. 1 is a diagram illustrating a specific example of how a measurement system 100 as Embodiment 1 is configured.

The measurement system 100 is configured to measure an electric signal that a signal output device 1 outputs. The signal output device 1 is configured to output an analog electric signal. The signal output device 1 is, for example, a sensor configured to output an electric signal corresponding to a physical quantity as a measurement target. In this case, the measurement system 100 includes an analog-to-digital (AD) conversion device 2, a recording device 3, and a terminal device 4.

The AD conversion device 2 is connected to the signal output device 1, and is configured to receive an analog signal outputted from the signal output device 1. The AD conversion device 2 is configured to convert an analog signal to a digital signal and output the digital signal as the result of the conversion to the recording device 3.

The recording device 3 is connected to the AD conversion device 2, and is configured to receive digital signals outputted sequentially from the AD conversion device 2. The recording device 3 starts an operation of recording a digital signal in a case where the recording device 3 has received a digital signal with a value (hereinafter referred to as "signal value") that satisfies a recording start condition. The recording device 3 records, in an internal memory, any digital signal that the recording device 3 receives after the recording device 3 starts the recording operation until the recording device 3 receives a digital signal having a value that satisfies a recording end condition.

The terminal device 4 is an information processing device such as a personal computer (PC), workstation, smartphone, mobile telephone, or tablet terminal. The terminal device 4 is configured to be communicable with the recording device 3. The terminal device 4 is used by the user of the measurement system 100 to enter various operations into the recording device 3.

As described above, the measurement system 100 is configured such that AD conversion by the AD conversion device 2 and an operation of recording a digital signal by the recording device 3 allow a digital signal resulting from an analog signal that the signal output device 1 outputs to be recorded on a time-series basis.

The description below deals in detail with how the AD conversion device 2 and recording device 3 of the present embodiment are configured.

The description below first deals with the hardware configuration of the AD conversion device 2. The AD conversion device 2 includes an analog input interface 21, an AD converter 22, a field programmable gate array (FPGA) 23, a read-only memory (ROM) 24, a processor 25, and a communication module 26.

The analog input interface 21 is an input interface for an analog signal. The analog input interface 21 allows the signal output device 1 and the AD conversion device 2 to be connected to each other, and allows an analog signal outputted from the signal output device 1 to be inputted into the AD conversion device 2.

The AD converter 22 is configured to convert an analog signal that the AD converter 22 has received through the analog input interface 21 into a digital signal. Specifically, the AD converter 22 is configured to (i) sample an analog signal over a short sampling period desired by the user (for example, several microseconds or so) and (ii) quantize the sampled analog signal at a predetermined quantization level, for conversion of the analog signal into a digital signal.

The FPGA 23 is a circuit configured to perform an arithmetic process on the digital signal as converted by the AD converter 22. Specific examples of the arithmetic process include a digital filter process and an offset/span setting process. Specific examples of the digital filter process include a smoothing process involving use of a low pass filter or moving average. The FPGA 23 transmits the digital signal having undergone the arithmetic process to the recording device 3 via the communication module 26.

Specifically, the AD conversion device 2 stores, in the ROM 24 in advance, configuration data for configuring the FPGA 23 as a circuit for carrying out an arithmetic process. The FPGA 23 obtains, from the processor 25, configuration data read from the ROM 24 on activation of the AD conversion device 2, and carries out a process (typically referred to as "configuration") of configuring a logic circuit based on the configuration data obtained. The FPGA 23 carries out such a process to configure itself as a circuit for carrying out an arithmetic process.

The communication module 26 is a communication interface for the AD conversion device 2 to communicate with the recording device 3. The communication module 26 is connected to a first communication module 31 of the recording device 3, and is configured to transmit, to the recording device 3, a digital signal on which the FPGA 23 has carried out an arithmetic process.

The description below deals with the hardware configuration of the recording device 3. The recording device 3 includes a first communication module 31, a second communication module 32, an auxiliary storage device 33, a buffer memory 34, a random access memory (RAM) 35, and a processor 36, which are all connected to one another through an internal bus 30. The recording device 3 is, for example, a programmable logic controller (PLC).

The first communication module 31 is a communication interface for the recording device 3 to communicate with the AD conversion device 2. The first communication module 31 is connected to the communication module 26 of the AD conversion device 2, and is configured to receive a digital signal transmitted from the AD conversion device 2. The first communication module 31 stores a digital signal that the first communication module 31 has received into the buffer memory 34.

The second communication module 32 is a communication interface for the recording device 3 to communicate with the terminal device 4. The second communication module 32 is connected to a communication interface of the terminal device 4, and is configured to transmit and receive various pieces of information to and from the terminal device 4.

The auxiliary storage device 33 is a storage device such as a magnetic hard disk device or semiconductor storage device. The auxiliary storage device 33 is configured to store various pieces of settings information necessary for the recording device 3 to operate and/or various pieces of information that the recording device 3 has obtained or generated.

The buffer memory 34 is a storage device such as a magnetic hard disk device or semiconductor storage device. The buffer memory 34 is configured to store the value of a digital signal that the first communication module 31 has received from the AD conversion device 2. The buffer memory 34 repeats storing and erasing of a signal value over a predetermined operating period. The processor 36 is an arithmetic unit such as a central processing unit (CPU). The processor 36 is configured to access the buffer memory 34 in synchronization with the above operating period, read the signal value stored in the buffer memory 34, and records the signal value into the RAM 35.

The RAM 35 and the processor 36 are configured to carry out various processes for a recording operation of the recording device 3. Specifically, the processor 36 reads a program on the auxiliary storage device 33 into the RAM 35 and executes the program. The execution of programs allows the recording device 3 to function as a device having a functional configuration illustrated in FIG. 2 to carry out an operation of recording a signal value.

Figure 2:
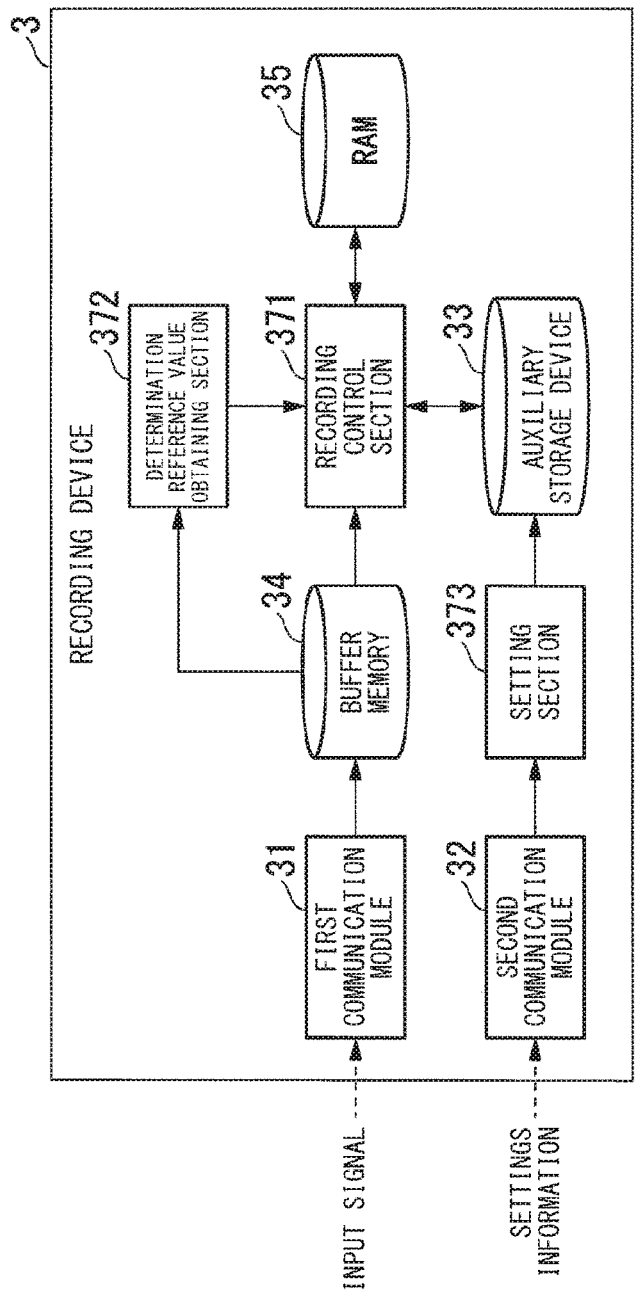
FIG. 2 is a block diagram illustrating a specific example of the functional configuration of a recording device of Embodiment 1.

The description below deals with the functional configuration of the recording device 3. FIG. 2 is a block diagram illustrating a specific example of the functional configuration of the recording device 3 of Embodiment 1. The above execution of programs allows the recording device 3 to function as a device including a recording control section 371, a determination reference value obtaining section 372, and a setting section 373. The individual functions of the recording device 3 may all or in part be achieved by hardware such as an application specific integrated circuit (ASIC), programmable logic device (PLD), or FPGA. The programs may be stored on a computer-readable recording medium. Examples of the computer-readable recording medium include a transportable medium such as a flexible disk, a magneto-optical disk, a ROM, or a CD-ROM and a storage device such as a hard disk built in a computer system. The programs may alternatively be transmitting through an electric telecommunications line.

The recording control section 371 is configured to obtain a signal value stored in the buffer memory 34 and record the signal value into the RAM 35. The description below uses expressions such as "recording operation" to refer to an operation by the recording control section 371 of recording, into the RAM 35, a signal value that the recording control section 371 has obtained from the buffer memory 34. The recording control section 371 is configured to refer to signal values read sequentially into the buffer memory 34 and in a case where a signal value satisfies a recording start condition, start a recording operation. A recording start condition is set in advance by the setting section 373 for the recording device 3. The recording start condition is that as compared to signal values inputted over a predetermined time period (hereinafter referred to as "reference time period") after the recording device 3 started receiving a signal value, a signal value inputted after the reference time period has elapsed has changed greatly. The recording start condition is defined on the basis of a determination reference value obtained on the basis of values during the reference time period. A determination reference value indicates a feature of signal values inputted during the reference time period.

The description below deals with a specific example of the recording start condition. For Embodiment 1, the determination reference value indicates the degree of a change among signal values during the reference time period. The recording start condition for Embodiment 1 is whether a value indicative of the degree of a change among signal values after the reference time period has elapsed (hereinafter referred to as "change value") exceeds a predetermined threshold value determined on the basis of the determination reference value (hereinafter referred to as "determination threshold value"). The recording control section 371 determines in a case where a change value indicative of the degree of a change among signal values inputted after the reference time period has elapsed has become not less than the determination threshold value that a recording start condition has been satisfied.

The recording control section 371, after starting a recording operation, ends the recording operation in a case where a recording end condition has been satisfied. A recording end condition is set in advance by the setting section 373 for the recording device 3. The recording end condition may be, for example, (i) a condition that an inputted signal value is to satisfy or (ii) a condition related to a time period that elapses after the start of a recording operation. The recording end condition may alternatively be whether the recording device 3 has received from the terminal device 4 an instruction to end the recording operation.

The recording control section 371 is configured to, in response to the end of a recording operation, obtain time-series signal values accumulated in the RAM 35 and record the signal values into the auxiliary storage device 33.

The determination reference value obtaining section 372 is configured to obtain a determination reference value on the basis of signal values during the reference time period. A determination reference value indicates a change among signal values inputted during the reference time period. The determination reference value obtaining section 372 is configured to output, to the recording control section 371, the determination reference value that the determination reference value obtaining section 372 has obtained.

The setting section 373 is configured to register various settings related to how the recording device 3 operates. Specifically, the setting section 373 communicates with the terminal device 4 through the second communication module 32 to obtain, from the terminal device 4, information necessary for registration of various settings. The setting section 373 is configured to generate settings information on the basis of the information obtained from the terminal device 4 and record, into the auxiliary storage device 33, the settings information that the setting section 373 has generated. The setting section 373 records settings information into the auxiliary storage device 33 as above for registration of various settings for the recording device 3. In a case where the auxiliary storage device 33 has settings information registered therein in advance, the setting section 373 may update the settings information on the basis of information that the setting section 373 has obtained from the terminal device 4. The setting section 373 registers, for example, information related to a determination threshold value as settings information.

Figures 3, 4:
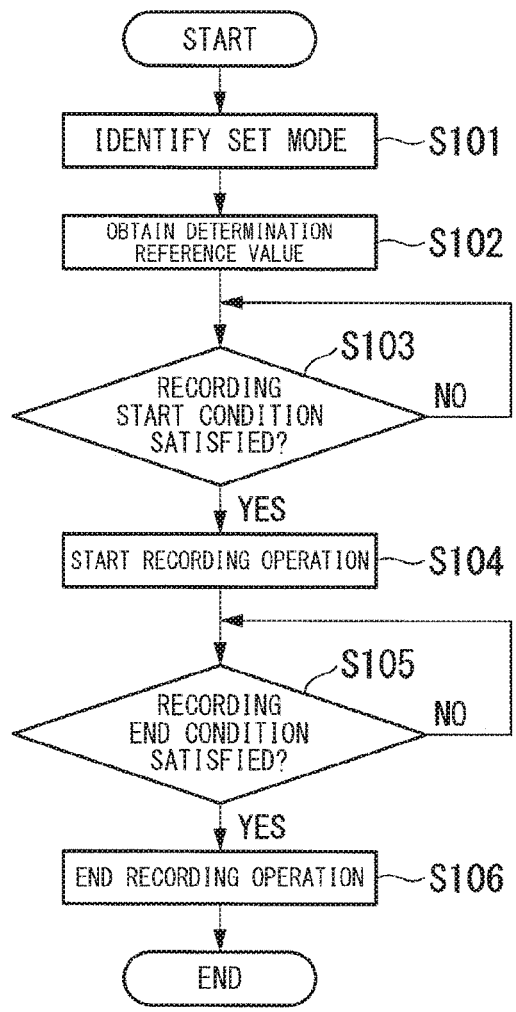
FIG. 3 is a diagram illustrating a specific example of settings information of Embodiment 1.
FIG. 4 is a flowchart illustrating an example of how the recording device of Embodiment 1 operates.

FIG. 3 is a diagram illustrating a specific example of settings information for Embodiment 1. Settings information is stored in the auxiliary storage device 33 in the form of, for example, a settings information table illustrated in FIG. 3. A settings information table contains a threshold record for each determination mode. A threshold record includes respective values for a determination mode, magnification, and set mode. The determination mode indicates the type of the recording start condition. A recording start condition may include a plurality of types. The example of FIG. 3 shows "INSENSITIVE MODE", "NORMAL MODE", and "SENSITIVE MODE" in the determination mode column. A magnification is a value for selecting a determination threshold value for the corresponding determination mode. A determination reference value is, for example, multiplied by a magnification to obtain a determination threshold value. The individual determination modes are associated with respective magnifications different from each other. A set mode indicates which determination mode among a plurality of determination modes is used for a process of determining the current recording start condition. Which determination mode is to be used as a set mode may be set by, for example, the user operating the terminal device 4.

The specific example of FIG. 3 has three determination modes "INSENSITIVE MODE", "NORMAL MODE", and "SENSITIVE MODE" and respective magnifications "700%", "500%", and "300%" in association with the three determination modes. The specific example of FIG. 3 is an example in which the set mode is "SENSITIVE MODE" among the three determination mode.

FIG. 4 is a flowchart illustrating an example of how the recording device 3 of Embodiment 1 operates. The description below assumes for brevity that the signal output device 1 is a sensor configured to, in response to an event as a recording target, output an electric signal correlated with a physical quantity related to the event. The description below also assumes that at the start of the flowchart, (i) the signal output device 1 is connected to the analog input interface 21 of the AD conversion device 2 and is continuously carrying out a sensing operation, and (ii) the AD conversion device 2 is already carrying out an AD conversion of an analog signal that the signal output device 1 outputs and outputting a digital signal to the recording device 3.

First, the recording control section 371 of the recording device 3 identifies the set mode on the basis of settings information stored in the auxiliary storage device 33 (step S101). In a case where, for instance, the auxiliary storage device 33 has settings information registered as in the examples of FIG. 3, the recording control section 371 identifies the current set mode as the sensitive mode. This means that in this case, the magnification for selecting a determination threshold value is "300%."

Subsequently, the determination reference value obtaining section 372 obtains, over the reference time period, digital signals accumulated sequentially in the buffer memory 34. The determination reference value obtaining section 372 obtains a determination reference value on the basis of the signal values that the determination reference value obtaining section 372 has obtained (step S102). The determination reference value obtaining section 372, for example, obtains, as the determination reference value, information on the range of a change among signal values that the determination reference value obtaining section 372 has obtained over the reference time period. The range of a change may be, for example, the difference between the maximum value and minimum value among time-series signal values that the determination reference value obtaining section 372 has obtained over the reference time period. The determination reference value obtaining section 372 notifies the recording control section 371 of the determination reference value that the determination reference value obtaining section 372 has obtained.

Subsequently, the recording control section 371 starts a process of determining when to start a recording operation (hereinafter referred to as "timing determining process"). During the timing determining process, the recording control section 371 determines on the basis of signal values that the recording control section 371 obtains sequentially whether a recording start condition has been satisfied (step S103). If the recording start condition has not been satisfied (NO in step S103), the recording control section 371 repeats the timing determining process in step S103 until the recording start condition is satisfied. If the recording start condition has been satisfied (YES in step S103), the recording control section 371 starts an operation of recording signal values accumulated in the buffer memory 34 (step S104).

The recording control section 371, for instance, calculates as the determination threshold value the product of (i) the range of a change among signal values which range the recording control section 371 has obtained as the determination reference value and (ii) the magnification corresponding to the set mode. The recording control section 371 determines in a case where the value of a change among signal values that the recording control section 371 has obtained after the reference time period has elapsed has become not less than the determination threshold value that the recording start condition has been satisfied.

Subsequently, the recording control section 371, which has started a recording operation, determines whether a recording end condition has been satisfied (step S105). If the recording end condition has not been satisfied (NO in step S105), the recording control section 371 repeats the timing determining process in step S105 until the recording end condition is satisfied. If the recording end condition has been satisfied (YES in step S105), the recording control section 371 ends the recording operation (step S106). The recording control section 371, in response to the end of the recording operation, obtains time-series signal values accumulated in the RAM 35 and records the signal values into the auxiliary storage device 33.

The recording device 3 configured as above allows a time-series change among signal values to be recorded easily for a process of recording the respective time-series values of input signals. This is detailed as follows: The recording device 3 is configured to repeat determination of whether, as compared to signal values during an initial predetermined time period (during which the recording device 3 started to receive signal values), there has been a large change among signal values after the predetermined time period has elapsed. If the recording device 3 has determined that there has been a large change in the signal value, the recording device 3 starts a recording operation. This means that the recording device 3 does not start a recording operation until there is a large change in the signal value. This allows the recording device 3 to (i) prevent the storage space from being wasted by recording signal values during a time period during which no large change has occurred and (ii) record signal values after a large change has occurred. Further, the recording device 3 itself is configured to determine whether to start such a recording operation. This eliminates the need to determine when to start a recording operation by trial and error as conventional. The above arrangement thus allows a time-series change among signal values to be recorded more easily.

Figure 5:
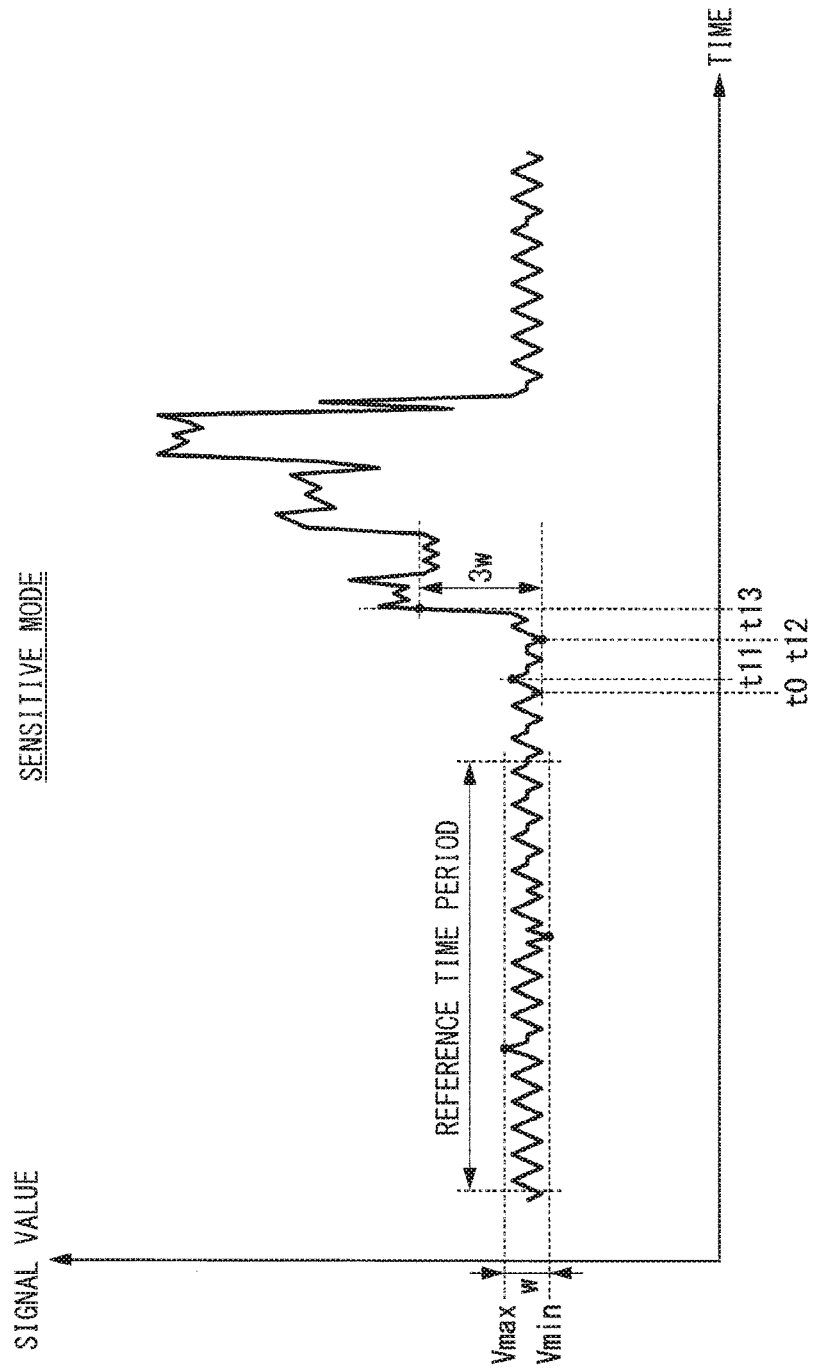
FIG. 5 is a diagram illustrating an example of how the measurement system as Embodiment 1 operates.

FIGS. 5 to 8 are each a diagram illustrating an example of how the measurement system 100 as Embodiment 1 operates. FIG. 5 illustrates an example of how the recording device 3 operates in the sensitive mode. In the example of FIG. 5, the determination reference value obtaining section 372 obtains, as a determination reference value w, the difference between the maximum value Vmax and minimum value Vmin among signal values during the reference time period. The recording control section 371 calculates a determination threshold value 3w on the basis of the determination reference value w and the magnification "300%" associated with the sensitive mode. The recording control section 371 starts a timing determining process at a time point t0, at which the reference time period elapses. The recording control section 371 repeats calculation of, on the basis of signal values that the recording control section 371 obtains sequentially, a change value among signal values that the recording control section 371 obtains after the time point t0. The change value is expressed as the difference between the maximum value and minimum value among signal values that the recording control section 371 has obtained after the start of the timing determining process. During a time period from the time point t0 to a time point t12, for instance, the signal has a maximum value at a time point t11 and a minimum value at the time point t12. The change value is thus expressed as the difference between the maximum value at the time point t11 and the minimum value at the time point t12. This change value is less than 3w, so the recording control section 371 does not start a recording operation. Then, the maximum value of the signal becomes updated at a time point t13, at which time point t13 the change value becomes 3w (that is, 300% of the determination reference value). The recording control section 371 then starts a recording operation at the time point t13. The recording device 3 thus records signal values after the time point t13.

Figure 6:
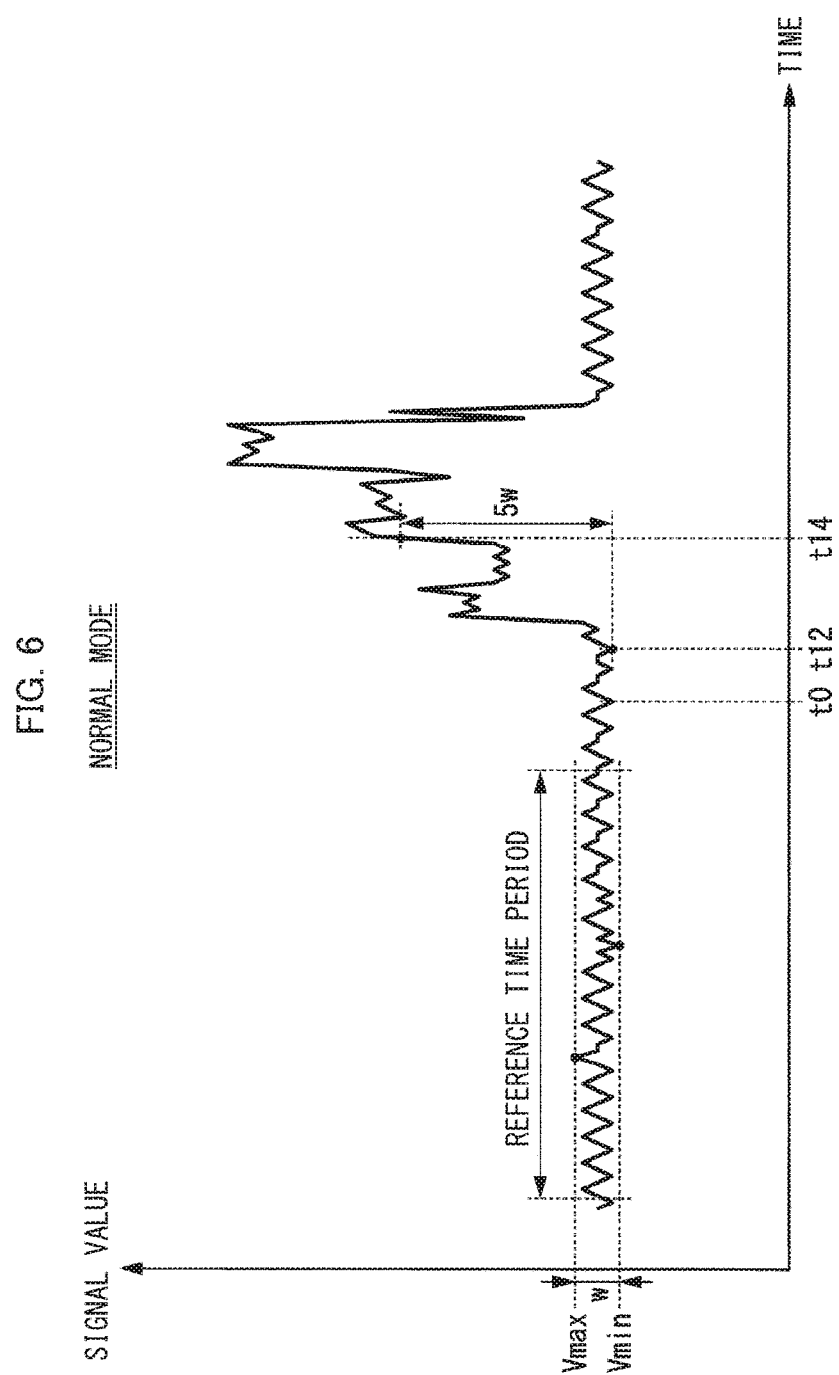
FIG. 6 is a diagram illustrating an example of how the measurement system as Embodiment 1 operates.

FIG. 6 illustrates an example of how the recording device 3 operates in the normal mode. In the example of FIG. 6, the recording control section 371 obtains signal values similar to those obtained in the example of FIG. 5. The recording control section 371 calculates a determination threshold value 5w on the basis of the determination reference value w and the magnification "500%" associated with the normal mode. During a time period from the time point t0 to a time point t14, the signal has a minimum value at the time point t12, and although the maximum value becomes updated as appropriate, the change value does not become not less than 5w. The recording control section 371 thus does not start a recording operation until the time point t14. At the time point t14, the maximum value becomes updated so that the change value is 5w (that is, 500% of the determination reference value). The recording control section 371 then starts a recording operation at the time point t14. The recording device 3 thus records signal values after the time point t14.

Figure 7:
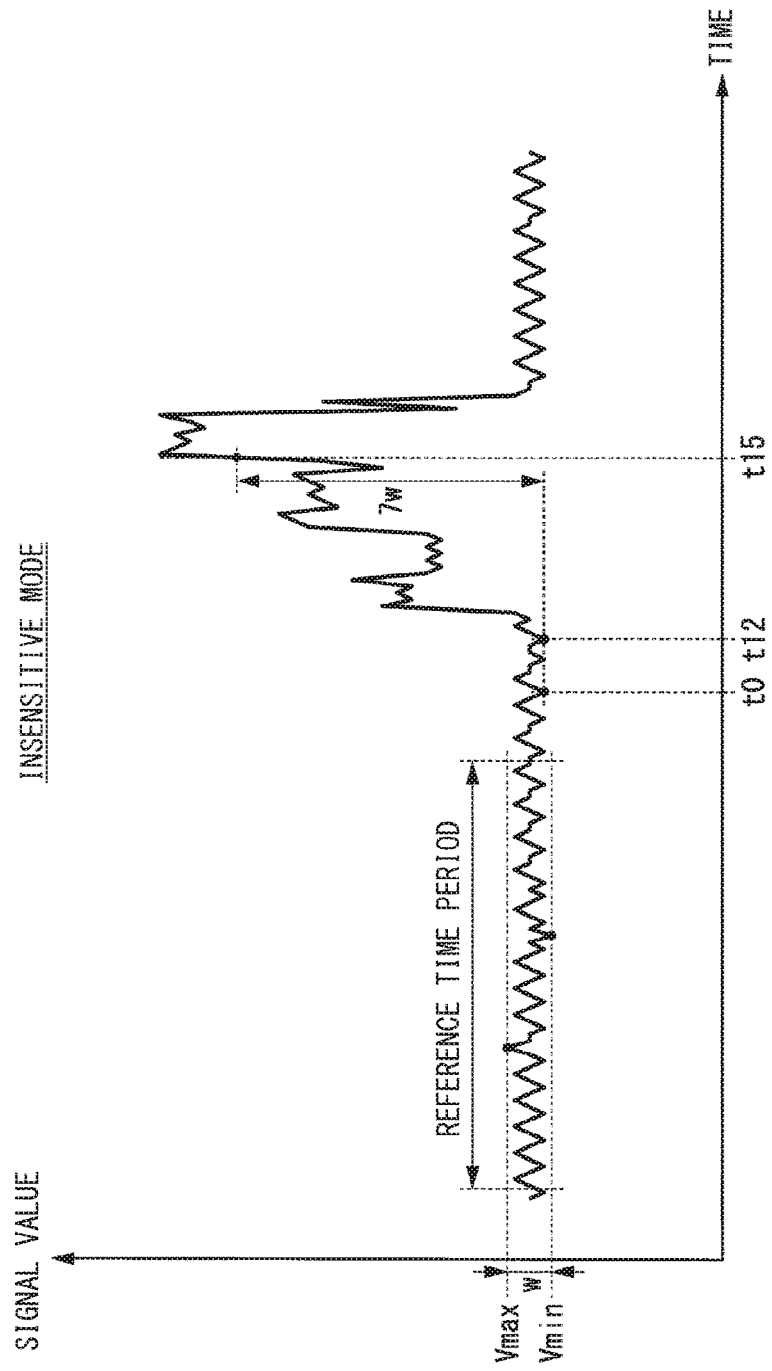
FIG. 7 is a diagram illustrating an example of how the measurement system as Embodiment 1 operates.

FIG. 7 illustrates an example of how the recording device 3 operates in the insensitive mode. In the example of FIG. 7, the recording control section 371 obtains signal values similar to those obtained in the example of FIG. 5. The recording control section 371 calculates a determination threshold value 7w on the basis of the determination reference value w and the magnification "700%" associated with the insensitive mode. During a time period from the time point t0 to a time point t15, the signal has a minimum value at the time point t12, and although the maximum value becomes updated as appropriate, the change value does not become not less than 7w. The recording control section 371 thus does not start a recording operation until the time point t15. At the time point t15, the maximum value becomes updated so that the change value is 7w (that is, 700% of the determination reference value). The recording control section 371 then starts a recording operation at the time point t15. The recording device 3 thus records signal values after the time point t15.

Figure 8:
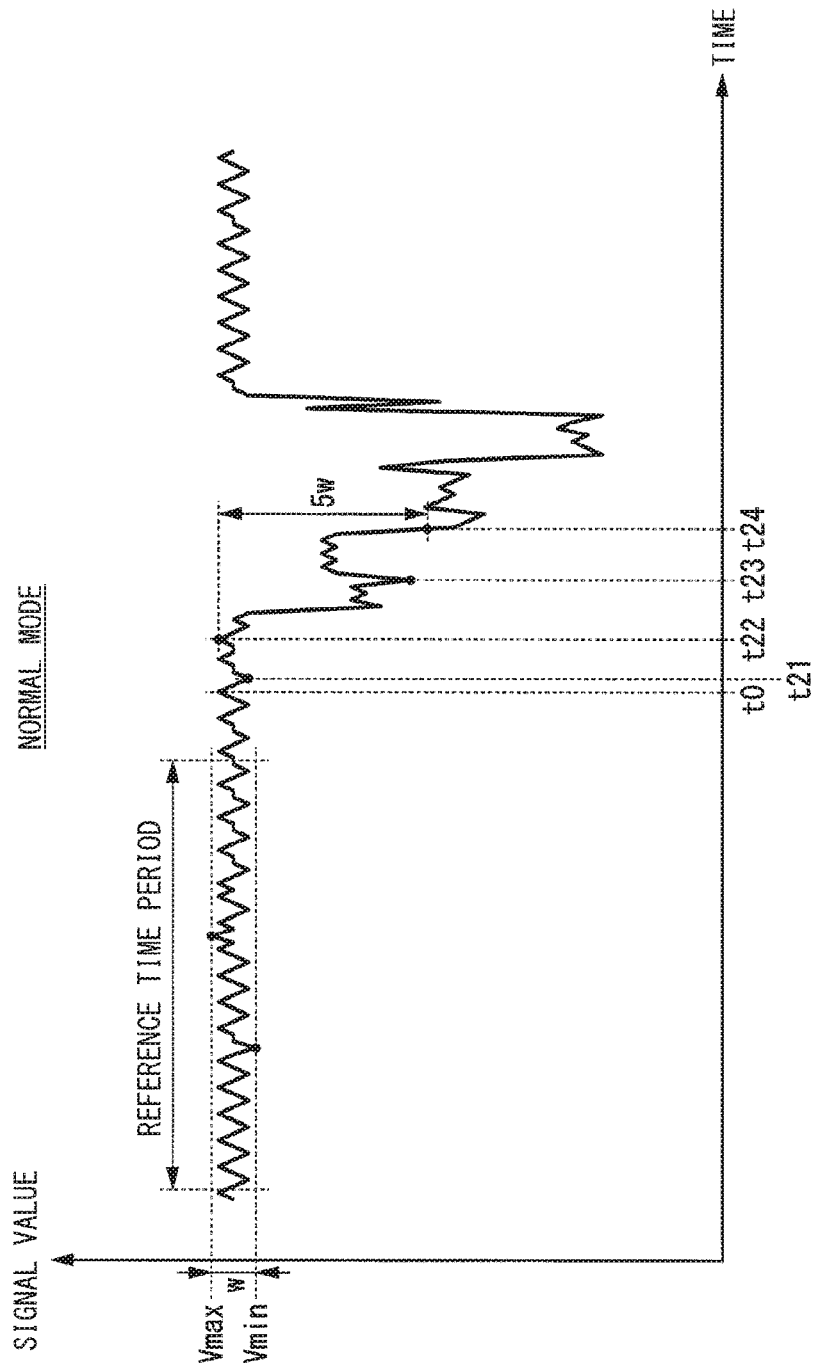
FIG. 8 is a diagram illustrating an example of how the measurement system as Embodiment 1 operates.

The description above has dealt with reference to FIGS. 5 to 7 with a case of a recording start condition becoming satisfied when the maximum value of a signal becomes updated after the reference time period has elapsed. The recording start condition may alternatively become satisfied when the minimum value of a signal becomes updated. FIG. 8 illustrates an example of how the measurement system 100 operates in such a case. FIG. 8 illustrates an example of how the recording device 3 operates in the normal mode. In the example of FIG. 8, the determination reference value obtaining section 372 obtains, as a determination reference value w, the difference between the maximum value Vmax and minimum value Vmin among signal values during the reference time period. The recording control section 371 calculates a determination threshold value 5w on the basis of the determination reference value w and the magnification "500%" associated with the normal mode. During a time period from the time point t0 to a time point t22, the signal has a minimum value at a time point t21 and a maximum value at the time point t22. At the time point t22, the change value is less than 5w, so the recording control section 371 does not start a recording operation. During a time period from the time point t22 to a time point t23, the minimum value of the signal becomes updated as appropriate, but the change value is less than 5w, so the recording control section 371 does not start a recording operation. Then, the minimum value of the signal becomes updated at a time point t24, at which time point t24 the change value becomes 5w. The recording control section 371 then starts a recording operation at the time point t24. The recording device 3 thus records signal values after the time point t24.

A signal output device such a sensor typically outputs a signal that normally fluctuates subtly even in a case where an event as a recording target has not changed, as illustrated in FIGS. 5 to 8. This output characteristic depends on, for example, the specification of the device and/or the environment in which the device is used. The recording device 3 of Embodiment 1 is configured to (i) obtain a determination reference value on the basis of signal values during a reference time period and (ii) determine, on the basis of the degree of a change among signal values in comparison to the determination reference value, whether a recording start condition has been satisfied. This allows the recording device 3 to start a recording operation at a time point suitable for the output characteristic of a signal output device 1 connected to the measurement system 100.

The recording device 3 of Embodiment 1 has a plurality of determination modes registered in advance that have respective determination threshold values different from each other. The recording device 3 detects a change among signal values with a detection sensitivity corresponding to the set mode selected from among the plurality of determination modes, and starts a recording operation as appropriate. The recording device 3 configured as above allows the user to simply select a determination mode to change the detection sensitivity of the recording device 3. This in turn allows the user to more easily measure a physical quantity with any of different detection sensitivities.

Variation

The recording device 3 may be configured to notify the user that the timing determining process has started. The recording device 3 may, for instance, include an indicator lamp such as a lamp configured to be turned on or off or blink for notification that the timing determining process has started. The recording device 3 may include a sound output device such as a loudspeaker configured to output a sound for notification that the timing determining process has started. The recording device 3 may, for instance, include a notifying section configured to notify the terminal device 4 that the timing determining process has started. The recording device 3 may similarly include a mechanism (for example, an indicator lamp, sound output device, and/or notifying section mentioned above) for notification that a recording operation has started.

Embodiment 2

Figure 9:
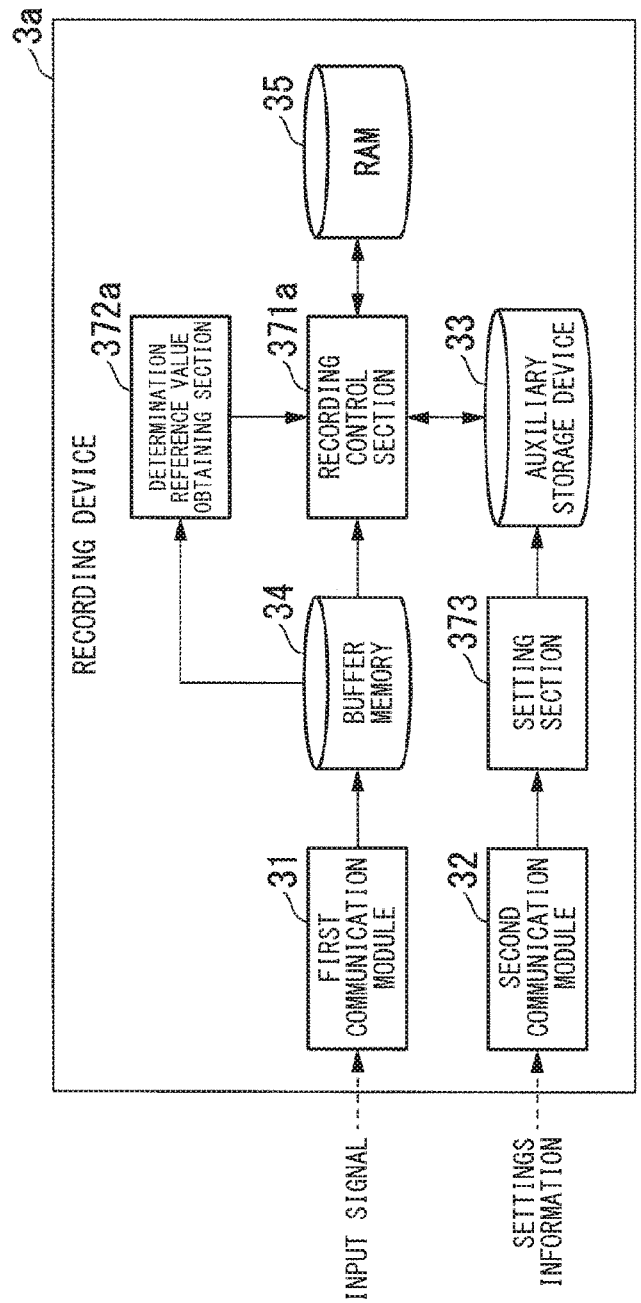
FIG. 9 is a block diagram illustrating a specific example of the functional configuration of a recording device of Embodiment 2.

FIG. 9 is a block diagram illustrating a specific example of the functional configuration of a recording device 3a of Embodiment 2. The recording device 3a differs from the recording device 3 of Embodiment 1 in that the recording device 3a includes a recording control section 371a in place of the recording control section 371 and a determination reference value obtaining section 372a in place of the determination reference value obtaining section 372. The other functional sections of the recording device 3a are each similar to the corresponding section of the recording device 3 of Embodiment 1. Those functional sections of the recording device 3a which are each similar to the corresponding section for Embodiment 1 are each assigned the same reference sign as in FIG. 2 and are not described here.

The recording control section 371a has a recording start condition different from that for Embodiment 1. For Embodiment 2, the determination reference value indicates a statistic of signal values during the reference time period. The recording start condition for Embodiment 2 is whether the difference between (i) a signal value after the reference time period has elapsed and (ii) the determination reference value exceeds a determination threshold value. Examples of the statistic include the average value, intermediate value, mode, maximum value, and minimum value. The recording control section 371 determines in a case where the difference between (i) a signal value inputted after the reference time period has elapsed and (ii) the determination reference value has become not less than the determination threshold value that a recording start condition has been satisfied. The recording end condition for Embodiment 2 is similar to that for Embodiment 1.

FIG. 10 is a diagram illustrating a specific example of settings information for Embodiment 2. Settings information for Embodiment 2 differs from that for Embodiment 1 in that the former includes the value of a reference range in place of the magnification as a value for selecting a determination threshold value. The reference range indicates a threshold value for the difference between the determination reference value and a signal value. FIG. 10 shows an example in which three determination modes "INSENSITIVE MODE", "NORMAL MODE", and "SENSITIVE MODE" are associated with respective reference ranges w1, w2, and w3.

The recording device 3a configured as above determines when to start a recording operation basically through a process similar to that for the recording device 3 of Embodiment 1 illustrated in FIG. 4. Embodiment 2, however, differs from Embodiment 1 on how to obtain a determination reference value in step S102 and how to determine whether a recording start condition has been satisfied in step S103.

In step S102, the determination reference value obtaining section 372a obtains, as the determination reference value, a statistic of signal values obtained during the reference time period. In step S103, the recording control section 371a obtains, from settings information, the reference range corresponding to the current set mode, and obtains a determination threshold value on the basis of the determination reference value and the reference range. The description below uses, for example, (i) the term "first threshold value" to refer to a determination threshold value as the sum of the determination reference value and the reference range and (ii) the term "second threshold value" to refer to a determination threshold value as the difference between the determination reference value and the reference range. The recording control section 371a compares a signal value obtained after the reference time period has elapsed with the determination threshold value and, in a case where the signal value is smaller than the first threshold value and larger than the second threshold value, determines that the recording start condition has not been satisfied. In a case where the signal value is not less than the first threshold value or not more than the second threshold value, the recording control section 371a determines that the recording start condition has been satisfied.

Figure 11:
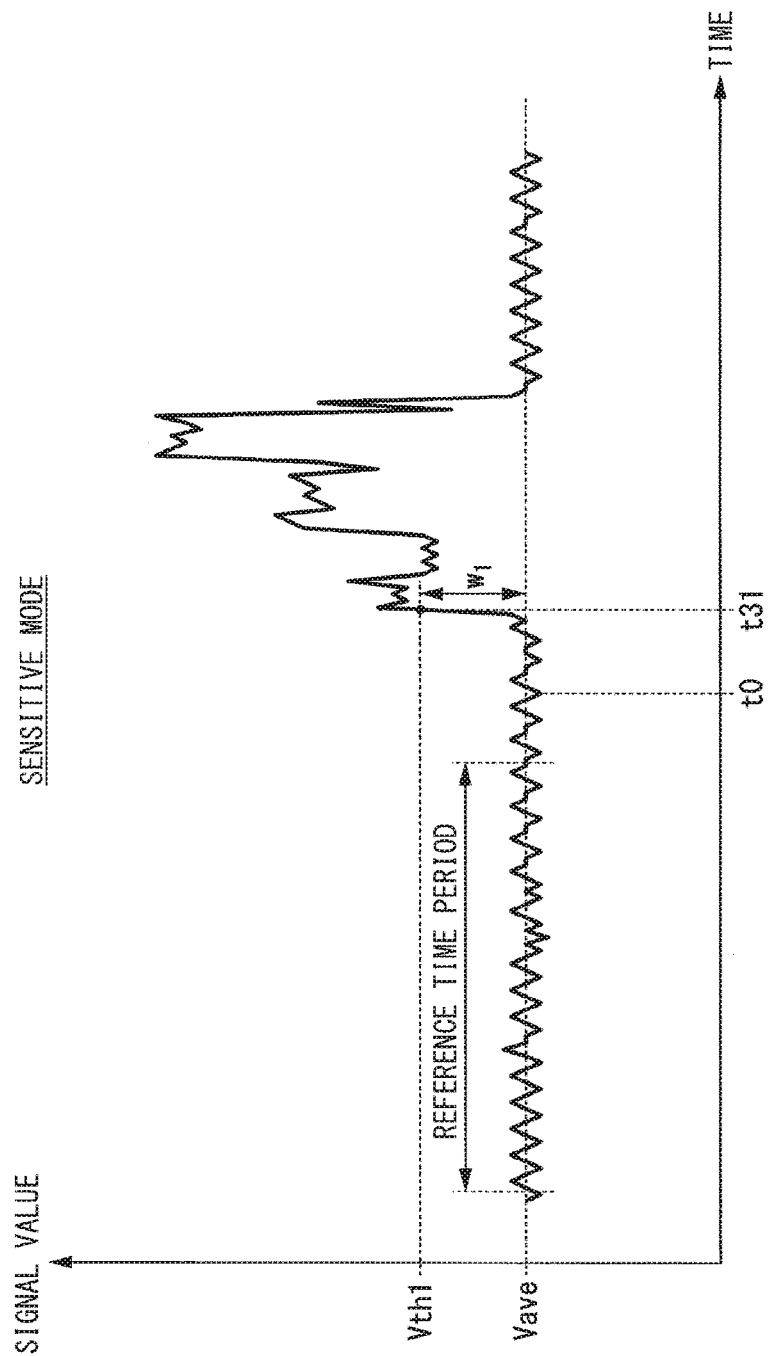
FIG. 11 is a diagram illustrating an example of how a measurement system as Embodiment 2 operates.

FIGS. 11 to 14 are each a diagram illustrating an example of how the measurement system 100 as Embodiment 2 operates. FIG. 11 illustrates an example of how the recording device 3a operates in the sensitive mode. In the example of FIG. 11, the determination reference value obtaining section 372a obtains, as a determination reference value, the average value Vave of signal values during the reference time period. The recording control section 371a obtains, as the first threshold value, the sum Vth1 of the determination reference value Vave and the reference range $w_1$ associated with the sensitive mode. The recording control section 371a obtains, as the second threshold value, the difference between the determination reference value Vave and the reference range $w_1$ associated with the sensitive mode. FIG. 11 shows only the first threshold value but not the second threshold value. The recording control section 371a starts a timing determining process at a time point t0, at which the reference time period elapses. The recording control section 371a compares a signal value obtained after the time point t0 with the first threshold value Vth1 and the second threshold value. During a time period from the time point t0 to a time point t32, the signal value does not exceed the determination threshold value, so the recording control section 371a does not start a recording operation. The signal value then becomes not less than the first threshold value Vth1 at a time point t31. This causes the recording control section 371a to start a recording operation at the time point t31. The recording device 3a thus records signal values after the time point t31.

Figure 12:
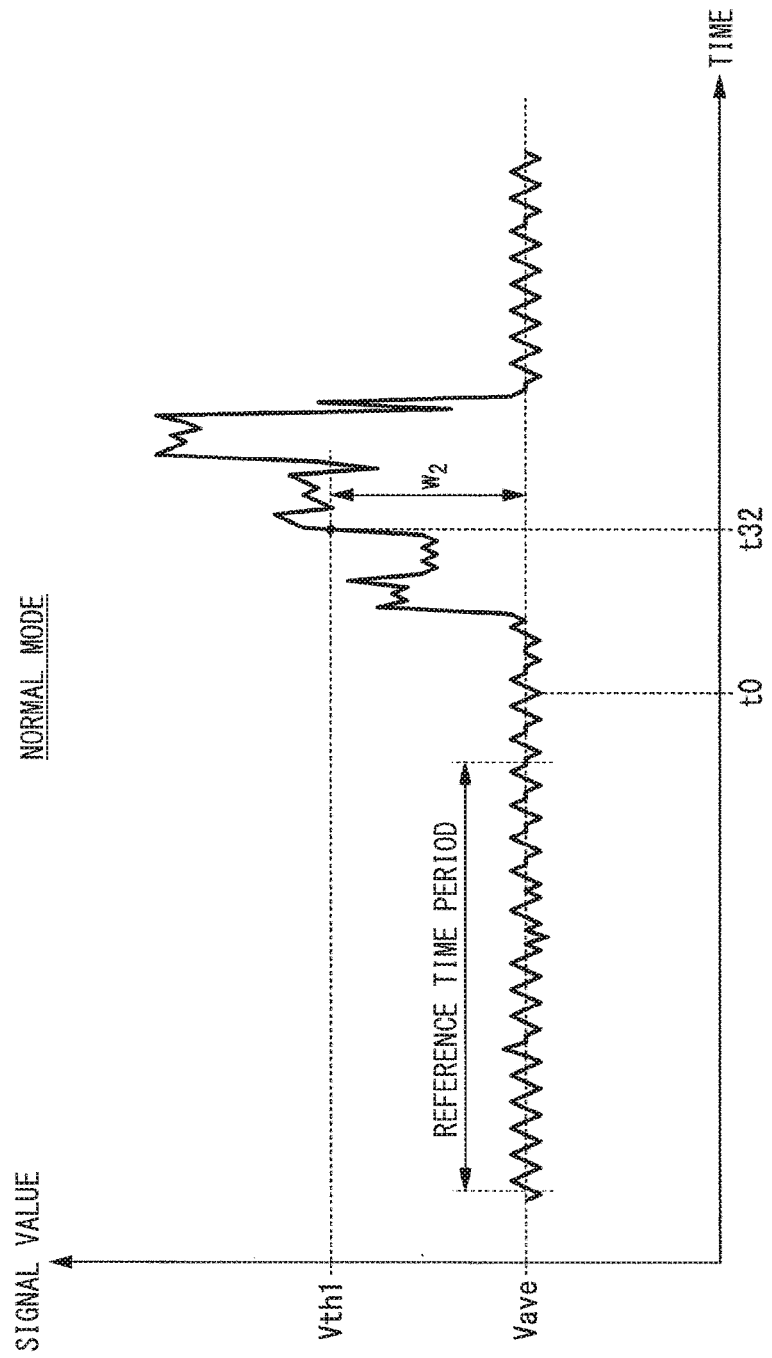
FIG. 12 is a diagram illustrating an example of how the measurement system as Embodiment 2 operates.

FIG. 12 illustrates an example of how the recording device 3a operates in the normal mode. In the example of FIG. 12, the recording control section 371a obtains signal values similar to those obtained in the example of FIG. 11. The recording control section 371a calculates a determination threshold value on the basis of the determination reference value Vave and the reference range $w_2$ associated with the normal mode. During a time period from the time point t0 to a time point t32, the signal value does not exceed the determination threshold value. The recording control section 371a thus does not start a recording operation until the time point t32. The signal value then becomes not less than the first threshold value Vth1 at the time point t32. This causes the recording control section 371a to start a recording operation at the time point t32. The recording device 3a thus records signal values after the time point t32.

Figure 13:
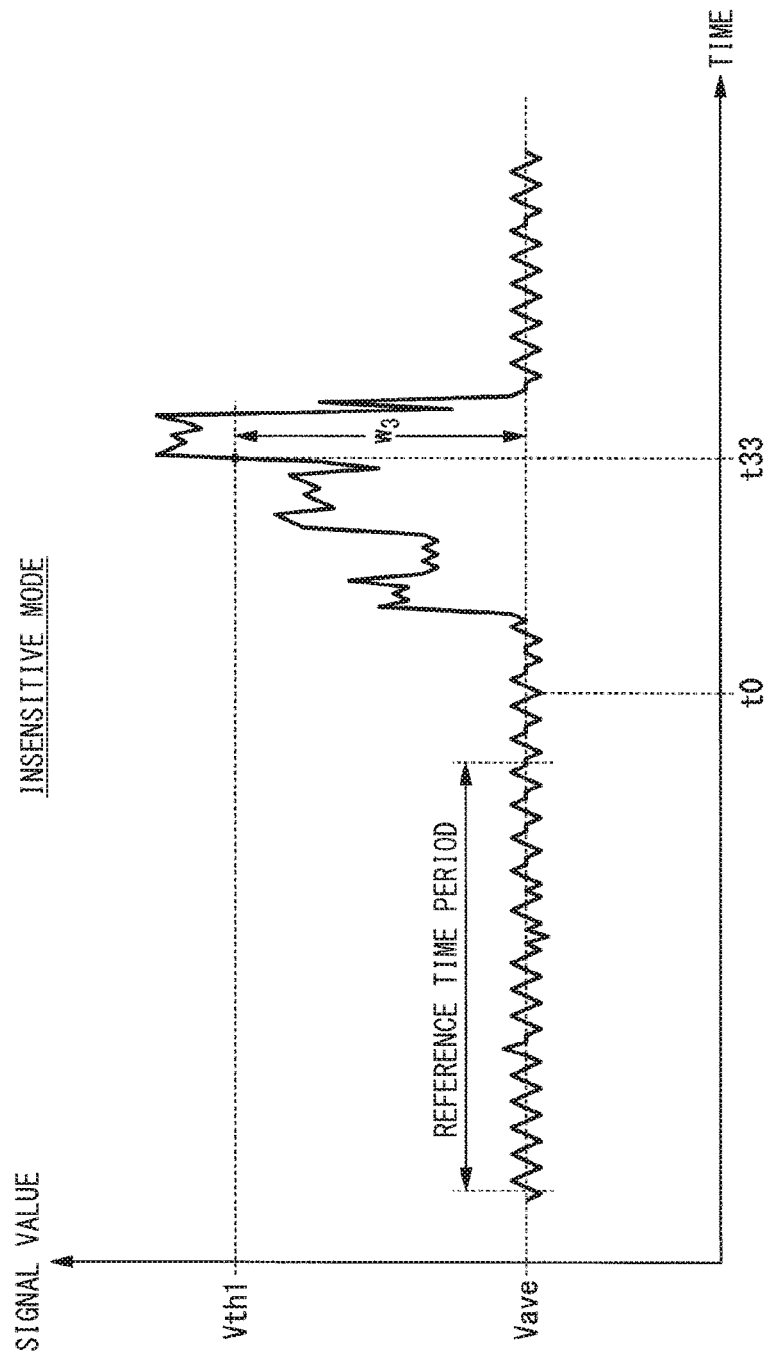
FIG. 13 is a diagram illustrating an example of how the measurement system as Embodiment 2 operates.

FIG. 13 illustrates an example of how the recording device 3a operates in the insensitive mode. In the example of FIG. 13, the recording control section 371a obtains signal values similar to those obtained in the example of FIG. 11. The recording control section 371a calculates a determination threshold value on the basis of the determination reference value Vave and the reference range $w_3$ associated with the insensitive mode. During a time period from the time point t0 to a time point t33, the signal value does not exceed the determination threshold value. The recording control section 371a thus does not start a recording operation until the time point t33. The signal value then becomes not less than the first threshold value Vth1 at the time point t33. This causes the recording control section 371a to start a recording operation at the time point t33. The recording device 3a thus records signal values after the time point t33.

Figure 14:
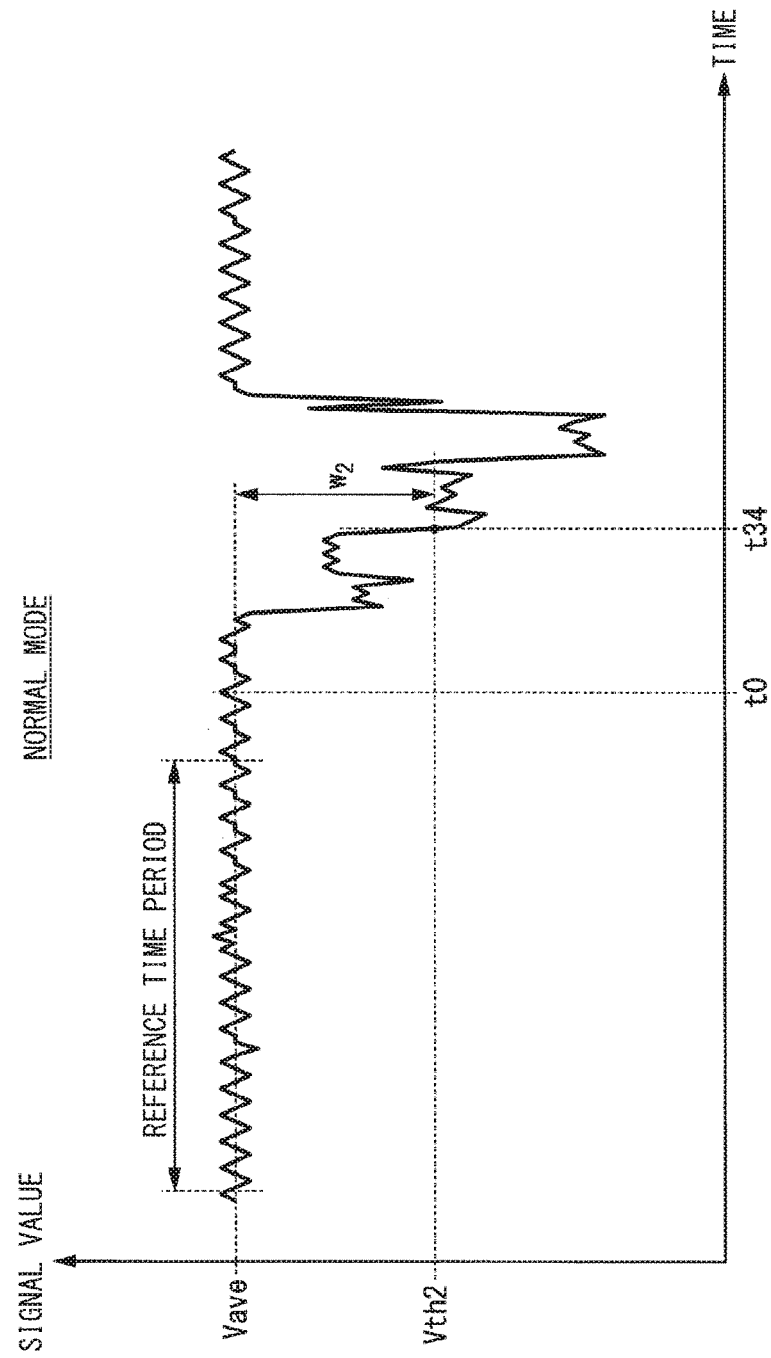
FIG. 14 is a diagram illustrating an example of how the measurement system as Embodiment 2 operates.

The description above has dealt with reference to FIGS. 11 to 13 with a case of the signal value exceeding the first threshold value. The recording start condition may alternatively become satisfied by the signal value exceeding the second threshold value. FIG. 14 illustrates an example of how the measurement system 100 operates in such a case. FIG. 14 illustrates an example of how the recording device 3a operates in the normal mode. The recording control section 371a calculates a determination threshold value on the basis of the determination reference value Vave and the reference range $w_2$ associated with the normal mode. During a time period from the time point t0 to a time point t34, the signal value does not exceed the determination threshold value. The recording control section 371a thus does not start a recording operation until the time point t34. The signal value then becomes not more than the second threshold value Vth2 at the time point t34. This causes the recording control section 371a to start a recording operation at the time point t34. The recording device 3a thus records signal values after the time point t34.

The description above has dealt with an example of the determination reference value obtaining section 372a determining on the basis of the first threshold value and the second threshold value whether the recording start condition has been satisfied. The determination reference value obtaining section 372a may alternatively be configured to determine on the basis of only either the first threshold value or the second threshold value whether the recording start condition has been satisfied.

The recording device 3a of Embodiment 2 configured as above, which differs from the recording device 3 of Embodiment 1 on how to obtain a determination reference value and how to determine whether the recording start condition has been satisfied, is capable of producing effects similar to those produced by the recording device 3 of Embodiment 1.

Embodiment 3

Figure 15:
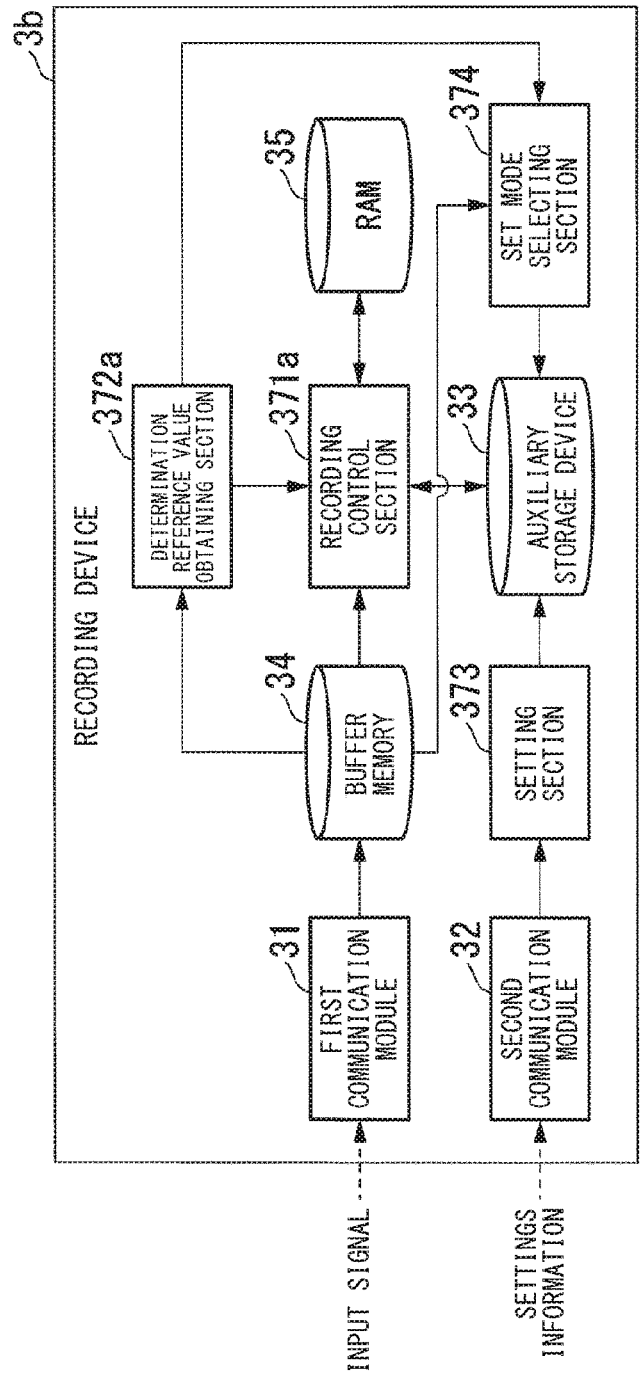
FIG. 15 is a block diagram illustrating a specific example of the functional configuration of a recording device of Embodiment 3.

FIG. 15 is a block diagram illustrating a specific example of the functional configuration of a recording device 3b of Embodiment 3. The recording device 3b differs from the recording device 3a of Embodiment 2 in that the recording device 3b further includes a set mode selecting section 374. The other functional sections of the recording device 3b are each similar to the corresponding section of the recording device 3a of Embodiment 2. Those functional sections of the recording device 3b which are each similar to the corresponding section for Embodiment 2 are each assigned the same reference sign as in FIG. 9 and are not described here.

The set mode selecting section 374 has the function of selecting a determination mode (that is, a set mode) for use in selecting a recording start condition. Specifically, the set mode selecting section 374 is configured to, on the basis of signal values obtained during a reference time period, select a determination mode from among preregistered determination modes for use as a set mode. The set mode selecting section 374 is configured to register the selected determination mode as a set mode to be included in settings information.

Figure 16:
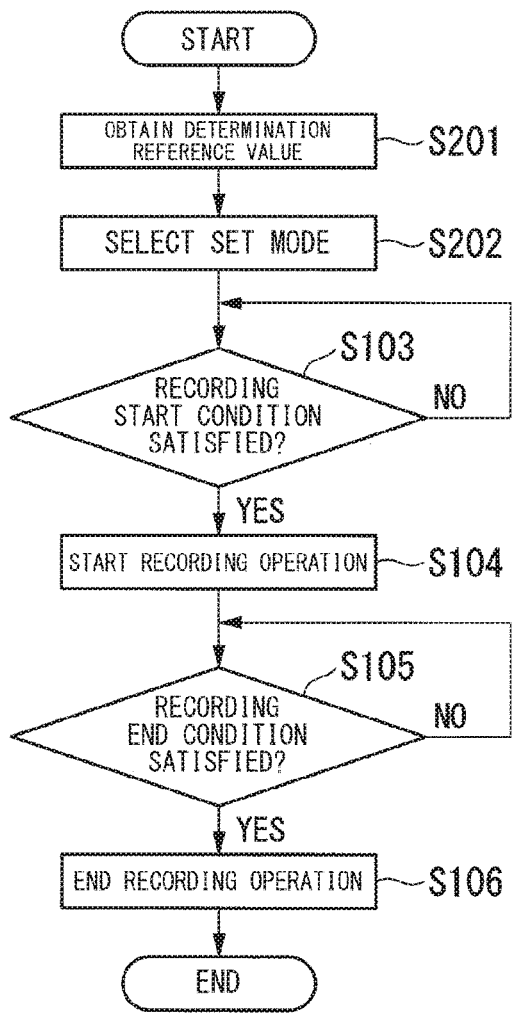
FIG. 16 is a flowchart illustrating an example of how the recording device of Embodiment 3 operates.

FIG. 16 is a flowchart illustrating an example of how the recording device 3b for Embodiment 3 operates. Those steps shown in FIG. 16 which are each similar to the corresponding step for Embodiment 2 are each assigned the same reference sign as in FIG. 4 and are not described here. The description below assumes that at the start of the flowchart illustrated in FIG. 16, (i) a sensor as the signal output device 1 is connected to the analog input interface 21 of the AD conversion device 2 and is continuously carrying out a sensing operation, and (ii) the AD conversion device 2 is converting an analog signal that the sensor outputs into a digital signal and outputting the digital signal to the recording device 3b.

First, the determination reference value obtaining section 372a obtains input signals by a method similar to that for Embodiment 2 to obtain a determination reference value (step S201). Specifically, the determination reference value obtaining section 372a obtains, as a determination reference value, a statistic of signal values that the determination reference value obtaining section 372a has obtained. The determination reference value obtaining section 372a notifies the set mode selecting section 374 of the determination reference value that the determination reference value obtaining section 372a has obtained.

Next, the set mode selecting section 374 selects a set mode from among a plurality of preregistered determination modes on the basis of the determination reference value of which the set mode selecting section 374 has been notified by the determination reference value obtaining section 372a (step S202). The set mode selecting section 374, for instance, obtains signal values inputted during the reference time period and obtains the maximum value and minimum value among the signal values that the set mode selecting section 374 has obtained. The set mode selecting section 374 selects, as a set mode, that determination mode from among a plurality of determination modes which has a determination threshold value that is larger than (i) the absolute value of the difference between the minimum value that the set mode selecting section 374 has obtained and the determination reference value and (ii) the absolute value of the difference between the maximum value that the set mode selecting section 374 has obtained and the determination reference value.

In a case where more than one determination mode satisfies the above criteria, the set mode selecting section 374 selects one of those determination modes in accordance with a predetermined rule. The set mode selecting section 374 may, for instance, select, as a set mode, that determination mode from among determination modes that satisfy the above criteria which has the largest determination threshold value. The set mode selecting section 374 may, for instance, select, as a set mode, that determination mode from among determination modes that satisfy the above criteria which has the smallest determination threshold value. The set mode selecting section 374 register the determination mode, which the set mode selecting section 374 has selected as above, as a set mode to be included in settings information. This allows steps S103 and later to determine whether the recording start condition has been satisfied, in the set mode that the set mode selecting section 374 has selected.

The recording device 3b of Embodiment 3 configured as above selects a determination mode as a set mode from among a plurality of preregistered determination modes in correspondence with the degree of a change among digital signals that the recording device 3b has obtained during a reference time period. This eliminates the need for the user to take the trouble to select a determination mode in measuring a physical quantity. The recording device 3b is thus capable of further saving the user trouble in measuring a physical quantity.

The recording devices 3, 3a, and 3b of the above-described embodiments may each be in the form of a computer. This may be achieved by recording a program for carrying out the functions on a computer-readable recording medium and causing a computer system to read the program recorded on the recording medium and execute the program. The term "computer system" as used herein is intended to cover an OS and hardware such as peripheral equipment. The term "computer-readable recording medium" refers to a transportable medium such as a flexible disk, a magneto-optical disk, a ROM, or a CD-ROM and a storage device such as a hard disk built in a computer system. The term "computer-readable recording medium" may further cover (i) a medium that dynamically keeps a program over a short time period such as a communication line for a case of transmitting a program over a network such as the internet or a communication line such as a telephone line and (ii) a medium that keeps a program over a certain time period such as a volatile memory inside the computer system of a server or client for the above case. The program may be (i) a program for carrying out part of the above-described functions, (ii) a program for combination with a program already recorded in a computer system to carry out the above-described functions, or (iii) a program achievable with use of a programmable logic device such as an FPGA.

The recording device of each of the above embodiments obtains digital signals over a predetermined reference time period in obtaining a determination reference value. Those digital signals are an example of the first signal for the present invention. The recording device of each of the above embodiments obtains digital signals after the reference time period has elapsed. Those digital signals are an example of the second signal for the present invention. The plurality of determination modes of each of the above embodiments are an example of the candidate value for the present invention.

Recap

An aspect of the present invention is a recording device including: a determination reference value obtaining section configured to obtain a determination reference value on a basis of signal values during a reference time period, the reference time period being a predetermined time period after a start of input of time-series signal values, the determination reference value indicating a feature of the signal values during the reference time period, and a recording control section configured to (i) obtain information on a recording start condition on a basis of the determination reference value, the recording start condition indicating whether, as compared to the signal values during the reference time period, there has been a large change among signal values after the reference time period has elapsed, and (ii) start recording signal values in response to the recording start condition becoming satisfied.

The recording device is, in another embodiment of the present invention, arranged such that the determination reference value obtaining section obtains, as the determination reference value, a value indicative of a degree of a change among the signal values during the reference time period, and the recording control section determines, on a basis of a change value exceeding a threshold value selected on a basis of the determination reference value, that the recording start condition has become satisfied, the change value indicating a degree of a change among the signal values after the reference time period has elapsed.

The recording device is, in another embodiment of the present invention, arranged such that the determination reference value obtaining section obtains, as the determination reference value, a statistic of the signal values during the reference time period, and the recording control section determines, on a basis of a difference exceeding a predetermined threshold value, that the recording start condition has become satisfied, the difference being a difference between the signal values after the reference time period has elapsed and the determination reference value.

An aspect of the present invention is a recording method including: a determination reference value obtaining section step of obtaining a determination reference value on a basis of signal values during a reference time period, the reference time period being a predetermined time period after a start of input of time-series signal values, the determination reference value indicating a feature of the signal values during the reference time period, and a recording control step of (i) obtaining information on a recording start condition on a basis of the determination reference value, the recording start condition indicating whether, as compared to the signal values during the reference time period, there has been a large change among signal values after the reference time period has elapsed, and (ii) starting recording signal values in response to the recording start condition becoming satisfied.

The description above has dealt with embodiments of the present invention in detail with reference to drawings. The present invention is, however, not limited to the embodiments in terms of detailed configuration, and has a scope covering, for example, a design that is not out of the outline of the present invention.

INDUSTRIAL APPLICABILITY

The present invention is applicable to any device for recording a signal.

REFERENCE SIGNS LIST

100 Measurement system
1 Signal output device
2 Analog-to-digital (AD) conversion device
21 Analog input interface
22 Converter
23 Field programmable gate array (FPGA)
24 Read-only memory (ROM)
25 Processor
26 Communication module
3, 3a Recording device
30 Internal bus
31 First communication module
32 Second communication module
33 Auxiliary storage device
34 Buffer memory
35 Random access memory (RAM)
36 Processor
371 Recording control section
372 Determination reference value obtaining section
373 Setting section
374 Set mode selecting section
4 Terminal device

The invention claimed is:
1. A recording device, comprising:
a determination reference value obtaining section configured to obtain a determination reference value on a basis of signal values during a reference time period, the reference time period being a predetermined time period after a start of input of time-series signal values, the determination reference value indicating a feature of the signal values during the reference time period, and
a recording control section configured to (i) obtain information on a recording start condition on a basis of the determination reference value, the recording start condition indicating whether, as compared to the signal values during the reference time period, there has been a large change among signal values during a timing determining process time period that begins after the reference time period has elapsed, and (ii) start recording signal values in response to the recording start condition becoming satisfied, the determination reference value obtaining section being configured to obtain, as the determination reference value, a difference between a maximum value and a minimum value among the signal values during the reference time period, the recording control section being configured to determine, on a basis of a difference between a maximum value and a minimum value among the signal values during the timing determining process time period exceeding a threshold value selected on a basis of the determination reference value, that the recording start condition has become satisfied.

2. A recording method, comprising:

a determination reference value obtaining section step of obtaining, as a determination reference value, a difference between a maximum value and a minimum value among signal values during a reference time period, the reference time period being a predetermined time period after a start of input of time-series signal values, the determination reference value indicating a feature of the signal values during the reference time period, and a recording control step of (i) obtaining information on a recording start condition on a basis of the determination reference value, the recording start condition indicating whether, as compared to the signal values during the reference time period, there has been a large change among signal values during a timing determining process time period that begins after the reference time period has elapsed, and (ii) starting recording signal values in response to the recording start condition becoming satisfied, the recording control step including determining, on a basis of a difference between a maximum value and a minimum value among the signal values during the timing determining process time period exceeding a threshold value selected on a basis of the determination reference value, that the recording start condition has become satisfied.

\* \* \* \* \*